(12) United States Patent
Krämer

(10) Patent No.: US 8,600,463 B2
(45) Date of Patent: Dec. 3, 2013

(54) CONDUCTOR ARRANGEMENT FOR A RESISTIVE SWITCHING ELEMENT HAVING AT LEAST TWO COMPOSITE CONDUCTORS MADE FROM SUPERCONDUCTING CONDUCTOR BANDS

(75) Inventor: Hans-Peter Krämer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 524 days.

(21) Appl. No.: 12/737,265

(22) PCT Filed: Apr. 9, 2009

(86) PCT No.: PCT/EP2009/054275
§ 371 (c)(1),
(2), (4) Date: Dec. 23, 2010

(87) PCT Pub. No.: WO2009/156197
PCT Pub. Date: Dec. 30, 2009

(65) Prior Publication Data
US 2011/0116198 A1    May 19, 2011

(30) Foreign Application Priority Data
Jun. 23, 2008    (DE) .......................... 10 2008 029 722

(51) Int. Cl.
*H01F 6/06* (2006.01)
*H01L 39/10* (2006.01)
*H02H 7/22* (2006.01)

(52) U.S. Cl.
USPC ........... 505/150; 505/238; 505/705; 505/924; 361/58; 361/19; 336/DIG. 1

(58) Field of Classification Search
USPC ................ 505/150, 211, 230, 238, 705, 904; 361/19, 58; 336/DIG. 1
See application file for complete search history.

(56) References Cited

U.S. PATENT DOCUMENTS 3,205,413 A    9/1965    Anderson
6,275,365 B1 *    8/2001    Kalsi et al. ...................... 361/19

(Continued)

FOREIGN PATENT DOCUMENTS

DE    1 564 722    2/1971
DE    42 34 312    4/1994

(Continued)

OTHER PUBLICATIONS

International Search Report for PCT/EP2009/054275, mailed on Jan. 9, 2009.

(Continued)

*Primary Examiner* — Stanley Silverman
*Assistant Examiner* — Kallambella Vijayakumar
(74) *Attorney, Agent, or Firm* — Staas & Halsey LLP

(57) ABSTRACT

A conductor arrangement for a resistive switching element, has at least first and second conductor connections disposed in a mutual plane adjacent to each other and insulated against each other. The composite conductors each have two conductor parts extending parallel, and forming a bifilar construction. The conductor parts are constructed from at least one superconducting conductor band. The composite conductors are formed into a coil winding, wherein the windings thereof substantially extend in the manner of a spiral, and are insulated against each other by a spacer.

18 Claims, 6 Drawing Sheets

(56) References Cited

U.S. PATENT DOCUMENTS

| | | | |
|---|---|---|---|
| 6,522,236 B1 * | 2/2003 | Ries | 338/13 |
| 7,981,841 B2 * | 7/2011 | Kramer et al. | 505/150 |
| 2008/0070788 A1 | 3/2008 | Kramer et al. | |
| 2009/0286685 A1 | 11/2009 | Krämer et al. | |

FOREIGN PATENT DOCUMENTS

| | | |
|---|---|---|
| DE | 10 2004 048 646 | 8/2006 |
| DE | 10 2006 032 702 | 10/2007 |
| DE | 10 2006 032 972 | 2/2008 |
| DE | 10 2008 029 722.4 | 6/2008 |
| EP | 0 503 447 | 9/1992 |
| JP | 2000-197263 | 7/2000 |
| RU | 2181517 | 4/2002 |
| RU | 2327253 | 6/2008 |
| WO | WO 2006/037741 * 4/2006 | H01L 39/16 |
| WO | PCT/EP2009/054275 | 4/2009 |

OTHER PUBLICATIONS

Japanese Office Action for related Japanese Patent Application No. 2011-513961, mailed Jun. 18, 2013, 10 pages.

\* cited by examiner

CONDUCTOR ARRANGEMENT FOR A RESISTIVE SWITCHING ELEMENT HAVING AT LEAST TWO COMPOSITE CONDUCTORS MADE FROM SUPERCONDUCTING CONDUCTOR BANDS

CROSS REFERENCE TO RELATED APPLICATIONS

This application is based on and hereby claims priority to International Application No. PCT/EP2009/054275 filed on Apr. 9, 2009 and German Application No. 10 2008 029 722.4 filed on Jun. 23, 2008, the contents of which are hereby incorporated by reference.

BACKGROUND

The present invention relates to a conductor arrangement for a resistive switching element.

Electrical energy is transported from the generator to the consumers in electrical power supply systems. In this case, shorts must be avoided since they can lead to irreparable damage to installations. One possible way to avoid shorts in electrical power supply systems is to use so-called short-circuit current limiters.

One particularly advantageous form with respect to the switching characteristics and costs in operation is that of superconducting short-circuit current limiters. Because of the superconduction, these have no power losses, or only very minor power losses, in operation, and are distinguished by their rapid, reversible switching. Their functional principle is based on a superconducting arrangement changing from the superconducting state to the normally conductive state when a short-circuit current occurs. The superconducting arrangement which is connected in series in the power supply system switches a resistance to the power supply system very quickly as a result of this change, limiting the short-circuit current. The power supply system and the installations connected to it are therefore protected against the short-circuit current. Once the short-circuit current has decayed, the short-circuit current limiter is able to remove the additional resistance from the power supply system again because, after it has cooled down below a critical temperature, the superconducting arrangement changes back from the normally conductive state to the superconducting state. This once again allows electrical power to be transmitted with virtually no losses via the current limiter in the power supply system.

Superconducting short-circuit current limiters with superconducting coils wound in a bifilar form alongside one another are known from the related art, for example from U.S. Pat. No. 6,275,365 B1. A coil is in each case formed from a conductor ribbon which has two conductor parts and is wound around a cylindrical coil core. The conductor ribbon is folded over itself, resulting in the two adjacent conductor parts, and each conductor part is electrically isolated from an adjacent conductor part by an insulator layer. Adjacent coils are wound at different positions along the axis of the cylindrical coil core. The adjacent coils may be connected in parallel with one another. However, this results in problems relating to the withstand voltage of the coils. The total voltage applied to a coil is in this design dropped across the two outer turns. In the case of rated voltages, in particular those which are greater than 10 kV, the inductances, the losses and the space required are very large because of the separations required between the conductor parts.

SUMMARY

One potential object is to specify an improved conductor arrangement for a resistive switching element, in particular for a short-circuit current limiter having the features mentioned initially, having a high withstand voltage with a compact design, low inductance and low alternating field losses, while providing good accessibility for coolant to the conductor ribbons that are used.

The inventor proposes a conductor arrangement for a resistive switching element. The proposed conductor arrangement has at least one first and at least one second conductor assembly, which are each formed from at least one superconducting conductor ribbon. Each conductor assembly in the conductor arrangement has two conductor parts, which run parallel, form a bifilar structure and are formed from the at least one conductor ribbon. The at least one first and the at least one second conductor assembly are formed on a common plane, running adjacent to one another, and are insulated from one another to form a common coil winding, the turns of which run largely in the form of a spiral.

In one preferred embodiment of the conductor arrangement, the spiral is in the form an Archimedes, a logarithmic, a hyperbolic or a fermatic spiral. In this case, the two conductor parts which run parallel and form a bifilar structure in a conductor assembly are each electrically and/or mechanically connected to one another at their ends and/or starts, wherein at least one connection point is formed.

In one particularly preferred embodiment, at least one connection point is in the form of two starts and/or ends which run to one another at a point. Alternatively, the at least one connection point formed in a U-shape, in particular in a shape which is bent to one side of the U-shape, and/or the connection can be in the form of a double U-shape, in particular an S-shape. It is also possible for the at least one conductor ribbon to have a partially elliptical, in particular partially circular, shape at the at least one connection point of a conductor assembly. Combinations of the shapes of the connection points are also possible.

One preferred embodiment provides that at least two connection points are arranged in a stack on the common plane. Alternatively, at least two connection points may also be arranged on a circumference of an ellipse, in particular of a circle, on the common plane. In this case, it is particularly preferable for the at least two connection points to be distributed uniformly on the circumference. They can preferably be arranged at or close to the center point of a spiral.

In one preferred embodiment, the superconducting conductor ribbon is composed of high-temperature superconductor material. Insulation is formed between adjacent conductor parts, in particular between adjacent conductor parts of a conductor assembly and between adjacent conductor parts of adjacent conductor assemblies. Preferably the insulation is in the form of at least one spacer, in particular a spacer which separates adjacent conductor parts by a spacing in the range from 2 to 3 mm.

The two conductor parts of a conductor assembly are in particular preferably designed to carry current in opposite directions. Adjacent conductor parts of adjacent conductor assemblies are designed to carry current in opposite directions.

In one particularly preferred embodiment of the conductor arrangement, the at least one first and the at least one second conductor assembly are connected in parallel. Alternatively, the at least one first and the at least one second conductor assembly can also be connected in series. Combinations of connections of different conductor assemblies are also possible.

The connection points of the conductor parts of conductor assemblies are preferably electrically and/or mechanically connected to one another. In the following text, the term connection means a connection of parts which were previously electrically and/or mechanically disconnected, or an electrical and/or mechanical connection which exists between conductor parts which are manufactured from one piece. In the former case a connection of previously disconnected parts, the connection may, for example, be made by soldering or welding.

The proposed conductor arrangement is in general based on the idea that a superconductor arrangement which is connected in series with the power supply system to be protected changes from the superconducting state to the normally conductive state when a short occurs, thus very quickly connecting a resistance into the power supply system, which limits the short-circuit current. When limiting occurs, virtually the entire rated voltage is dropped substantially linearly along the conductor arrangement in the current flow direction. In this case, the arrangement must optimally comply with criteria defined for the conductor ribbon, and this can advantageously be ensured with proposed refinements of the conductor arrangement.

On the one hand, the conductor ribbon should be arranged such that the inductance is as low as possible, in order that the current limiter is effectively "invisible" for the power supply system in the normal state. In principle, this can be achieved by arranging conductor areas with opposite current flow directions as close to one another as possible. As a rule of thumb, it can be said that the conductor separation should be less than the conductor width.

A further criterion for the arrangement of the conductor ribbon is to choose an arrangement in which alternating field losses which are as low as possible occur even for current limiters with rated currents of several kA (kiloamperes). Greater alternating field losses increase the total losses and therefore the operating costs, and necessitate the use of a larger and therefore more expensive refrigeration machine. Alternating field losses occur when magnetic flux moves into or out of the superconductor. The alternating field losses can in principle be kept small by suitable parallel connection of individual conductors with a relatively small cross section, or by an arrangement in which the resultant magnetic force is kept small, for example when currents flow in opposite directions, separated by distances which are as short as possible. In order to achieve this effect, the separation must be considerably less than the conductor width.

The arrangement of the conductor ribbon should be designed to be as compact as possible. Essentially, this can be achieved by short distances between the conductors within a switching element and between switching elements which may be present.

Furthermore, the arrangement of the conductor ribbon should allow good accessibility for the coolant. Liquid nitrogen is normally used as the coolant. Good accessibility of the coolant to the conductor ribbon allows rapid cooling down after a switching process. This can be achieved by the capability for the coolant to wet the conductor surface in an essentially exposed manner, apart from any thin insulating layer which may be present. In particular, the conductor arrangement should not be encapsulated, for example with an epoxy resin. In order to ensure rapid cooling down after a switching process, it is sufficient from experience to prevent a minimum separation of about 2-3 mm between adjacent conductor ribbons.

A further criterion for the arrangement of the conductor ribbon is the withstand voltage. The withstand voltage required in dielectric tests is roughly 5-10 times greater than the voltage which is present in the limiting case, and which corresponds approximately to the rated voltage of the power supply system. The withstand voltage is particularly important for use in high-voltage technology, and is normally achieved by greater separations, coating of the surfaces with plastics, or by encapsulation with epoxy resin. These requirements for the withstand voltage are therefore contradictory to the previously stated other requirements. An optimization between the criteria is achieved by the embodiment of a resistive switching element, that is to say a current limiter.

In particular, the arrangement of at least one first and at least one second conductor assembly, each formed from superconducting conductor ribbon in a bifilar form, running parallel on a common plane in the form of a spiral, results in an optimum embodiment on the basis of the criteria mentioned above. In this case, the isolation in the form of at least one spacer results in good accessibility for the coolant, and optimum separation for the conductor ribbon. The arrangement on one plane allows a particularly compact design. Connection of the conductor assemblies in parallel, for example, results in a current flow in opposite directions in all the adjacent conductor ribbons, thus minimizing the losses.

The parallel connection of a plurality of conductor ribbons keeps the length of the individual ribbons short, even for coils with large diameters. The rated voltage per coil therefore also remains low. In consequence, there is no need to increase the separation between the ribbons beyond the separation of 2-3 mm which is advantageous for the criteria, for withstand voltage reasons. The bifilar arrangement with short separations minimizes the magnetic folds which are produced, which leads both to a low inductance and to low alternating field losses. This arrangement is likewise advantageous for current limiters for low voltage, because the parallel connection of the ribbons allows larger coils to be used, thus making it possible to considerably improve the space utilization.

The arrangements of the conductor ribbons solve the problems relating to the withstand voltage, as they occur in bifilar disk-type coils or solenoid coils interleaved with one another according to the related art, since virtually the entire voltage on the coil is dropped between the two outer turns. The compact design reduces losses which occur at high voltage in arrangements with a large number of small coils which are connected in series or, for high rated currents, also connected in parallel, according to the related art. In embodiments in which all the coils are arranged axially in a row, this results in an unfavorable elongated geometry, and in the case of coils arranged alongside one another in parallel stacks, this necessarily results in poor space utilization in the cryostat. These problems are overcome with the arrangement.

A larger coil diameter also leads to poorer space utilization, to a higher inductance and to higher alternating field losses. A larger coil diameter increases the conductor length per coil and the rated voltage per coil. In consequence, the separation between the ribbons must also be increased in order to ensure the withstand voltage. For applications with high currents, there are possible ways to increase the critical current per ribbon by increasing the conductor width or by connecting an arrangement of a plurality of coils with narrow ribbons in parallel. An increase in the conductor current increases the alternating field losses more than proportionally, unless it is possible to use a bifilar arrangement with a very short separation between the windings. Connection of a large number of coils in parallel with narrow ribbons once again makes the space utilization worse. The arrangement of the conductor ribbons in contrast results in the capability to ensure optimum space utilization with minimized losses.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
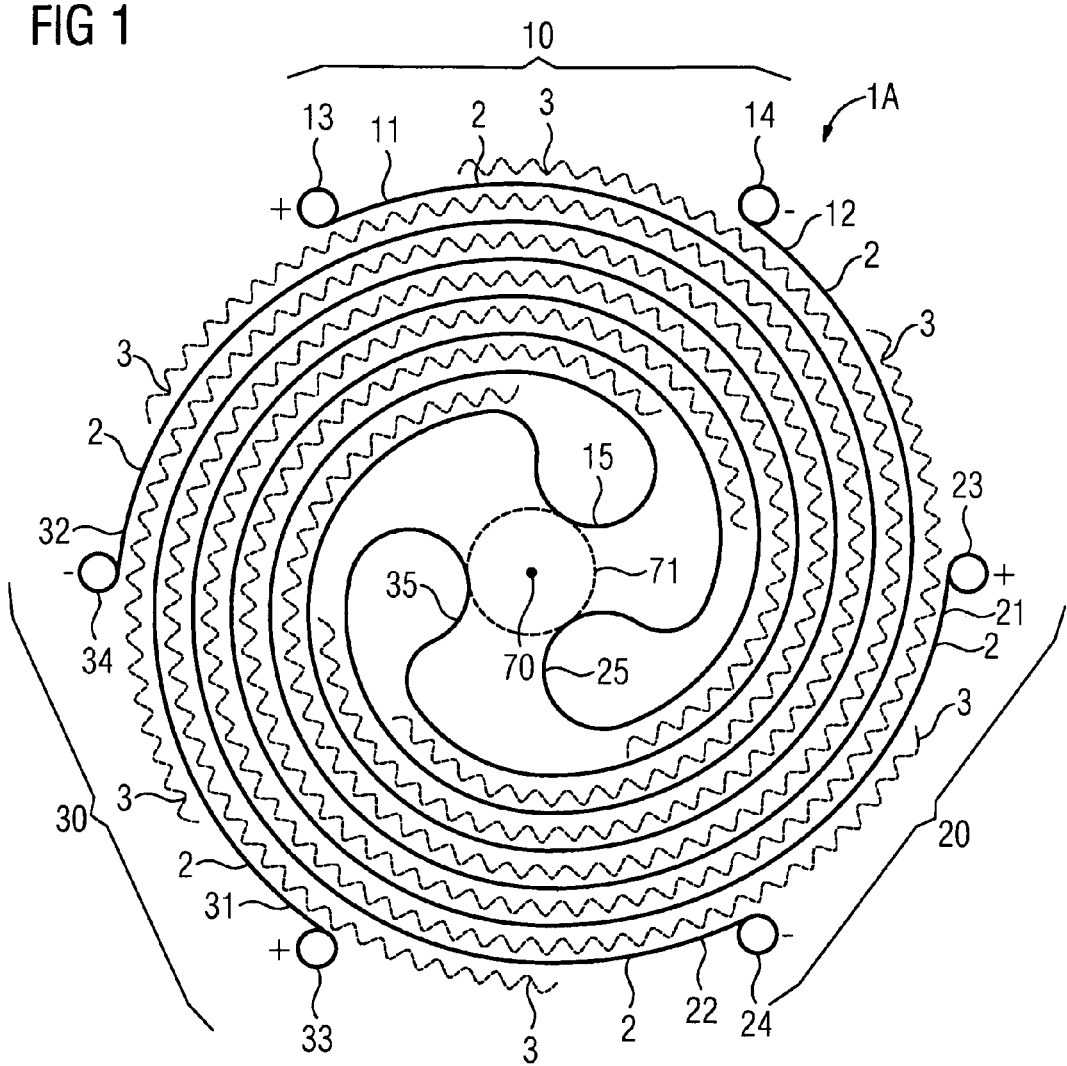
FIG. 1 shows a conductor arrangement according to one potential embodiment, for a resistive switching element with three conductor assemblies.

Reference will now be made in detail to the preferred embodiments of the present invention, examples of which are illustrated in the accompanying drawings, wherein like reference numerals refer to like elements throughout.

FIG. 1 shows a schematic illustration of a conductor arrangement 1A for a resistive switching element which comprises three conductor assemblies, the conductor assemblies 10, 20 and 30. Each conductor assembly 10, 20, 30 is formed from at least one superconducting conductor ribbon 2. Each conductor assembly 10, 20, 30 has two conductor parts 11, 12; 21, 22 and 31, 32, respectively, which run parallel, form a bifilar structure and each have a central connection point 15, 25, 35. The conductor assemblies 10, 20, 30 are arranged adjacent to one another on a common plane, and are isolated from one another. The conductor assemblies 10, 20, 30 are shaped to form a common coil winding, whose turns run largely in the form of a spiral. The connection points 15, 25, 35 of the conductor assemblies 10, 20, 30 are each partially circular and are arranged tangentially around the center point of the spiral 70 on the plane, with a circle radius 71.

Spacers 3 which are used as electrical isolators between the conductor ribbons 2, are in each case arranged between the two adjacent conductor parts 11, 12; 21, 22 and 31, 32 of a conductor assembly 10, 20, 30. The spacers 3 are shown as wavy lines in FIG. 1. They may be designed differently, and in particular the conductor ribbons 2 can be fixed both in a direction at right angles to the illustrated plane of the drawing and in the direction of the plane, that is to say relatively to one another. In general, the spacers 3 are formed from plastics such as Teflon or from other electrically insulating materials which are stable at low temperatures. The shapes of the spacers 3 are designed such that they allow good accessibility of coolant to the conductor ribbons 2. In this case, liquid nitrogen, in particular, is used as a coolant, although it is also possible to use other coolants, such as liquid helium or liquid neon.

The conductor ribbons 2 may be formed from superconducting material, such as the high-temperature superconductor material $Bi_2Sr_2Ca_2Cu_3O$ (BSCCO (2223)) in a silver casing, or for example from the rare-earth copper oxide YBCO, applied to a steel strip. One particularly preferred form of a conductor ribbon is provided by an embodiment in the form of a so-called Roebel conductor. Combinations of different superconducting materials with a low critical temperature (LTS materials) are also possible, such as NbTi or $Nb_3Sn$ and/or high-temperature superconductor (HTS) materials in or on normally conductive materials.

The conductor ribbons 2 of a bifilar conductor assembly 10, 20, 30 may be formed from one part or of a plurality of assembled parts. When an integral conductor ribbon 2 is used, a conductor assembly 10, 20, 30 is produced by folding a conductor ribbon 2 over itself, with the fold point being referred to in the following text as the connection point 15, 25, 35, and connecting the conductor parts 11, 12; 21, 22 and 31, 32 to one another. When the conductor ribbons 2 are joined together, this results in a bifilar conductor assembly 10, 20, 30 produced by stacking two conductor ribbons 2 one on top of the other, with one end in particular being joined together integrally, mechanically and electrically, and the respective conductor parts 11, 12; 21, 22 and 31, 32 thus each being mechanically and electrically connected to one another. In this case, the point at which the conductor ribbons 2 are joined together is referred to in the following text as the connection point 15, 25, 35. In the latter case, it may be joined together, for example, by soldering.

At the end of the at least one conductor ribbon 2 opposite the connection points 15, 25, 35, that is to say at the outer edge of the spiral in FIG. 1, connections 13, 14, 23, 24, 33, 34 for making electrical contact are fitted to the respective conductor parts 11, 12, 21, 22, 31, 32. Electrical contact can be made with the conductor parts 11, 12, 21, 22, 31, 32 via the connections 13, 14, 23, 24, 33, 34, in particular with them being connected in series or in parallel with one another, and with an external positive or negative voltage being applied to them.

In the exemplary embodiment illustrated in FIG. 1, the connections 13, 14, 23, 24, 33, 34 are arranged uniformly on an outer circumferential radius of the spiral. One conductor part of a conductor assembly in each case makes contact with a positive potential, and the other conductor part of a conductor assembly in each case makes contact with a negative potential (positive potential + and negative potential −), wherein the connections 13, 14; 23, 24 and 33, 34 of a respective bifilar conductor assembly 10, 20 or 30 are each arranged adjacent to one another on the circumferential radius. The conductor assemblies are arranged, and electrical contact is made with them, such that directly adjacent conductor parts of directly adjacent conductor assemblies each have potentials applied to them with opposite mathematical signs.

The three connection points 15, 25 and 35 of the conductor ribbon 2 of the three conductor assemblies 10, 20, 30 in FIG. 1 are each partially in circular form. They are arranged in the interior of the spiral, on a circle 71 around the center point 70 of the spiral. On the circle 71 in this case means that the circular shape of the connection point 15, 25, 35 in each case intersects the circle 71 around the center point 70 in particular at one and only one point.

Figure 2:
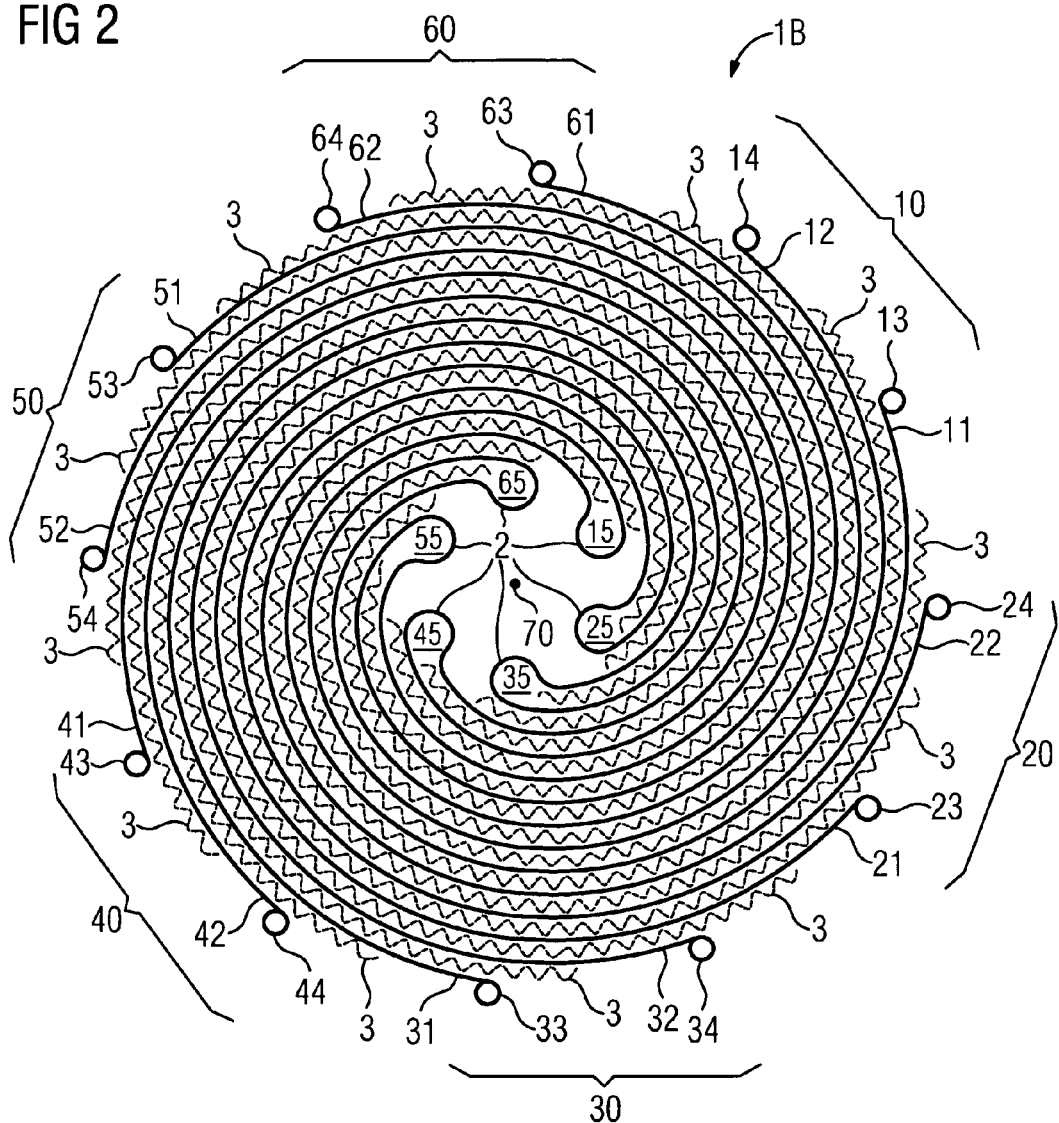
FIG. 2 shows a conductor arrangement analogous to that in FIG. 1, but with six instead of three conductor assemblies.

FIG. 2 shows a schematic illustration of an alternative embodiment of the conductor arrangement 1B. In contrast to the conductor arrangement 1A in FIG. 1, the conductor arrangement 1B in FIG. 2 has six instead of three conductor assemblies. The shape and arrangement of the conductor assemblies 10, 20, 30, 40, 50, 60 with their respective conductor parts 11, 12; 21, 22; 31, 32; 41, 42; 51, 52 and 61, 62, and the connection points 15, 25, 35, 45, 55, 65 in FIG. 2 are analogous to the shape and arrangement of the conductor assemblies 10, 20, 30 with their respective conductor parts 11, 12; 21, 22 and 31, 32, and connection points 15, 25, 35 in FIG. 1, with the exception of the spatial dimensions, because of the greater number of conductor assemblies.

Figure 3:
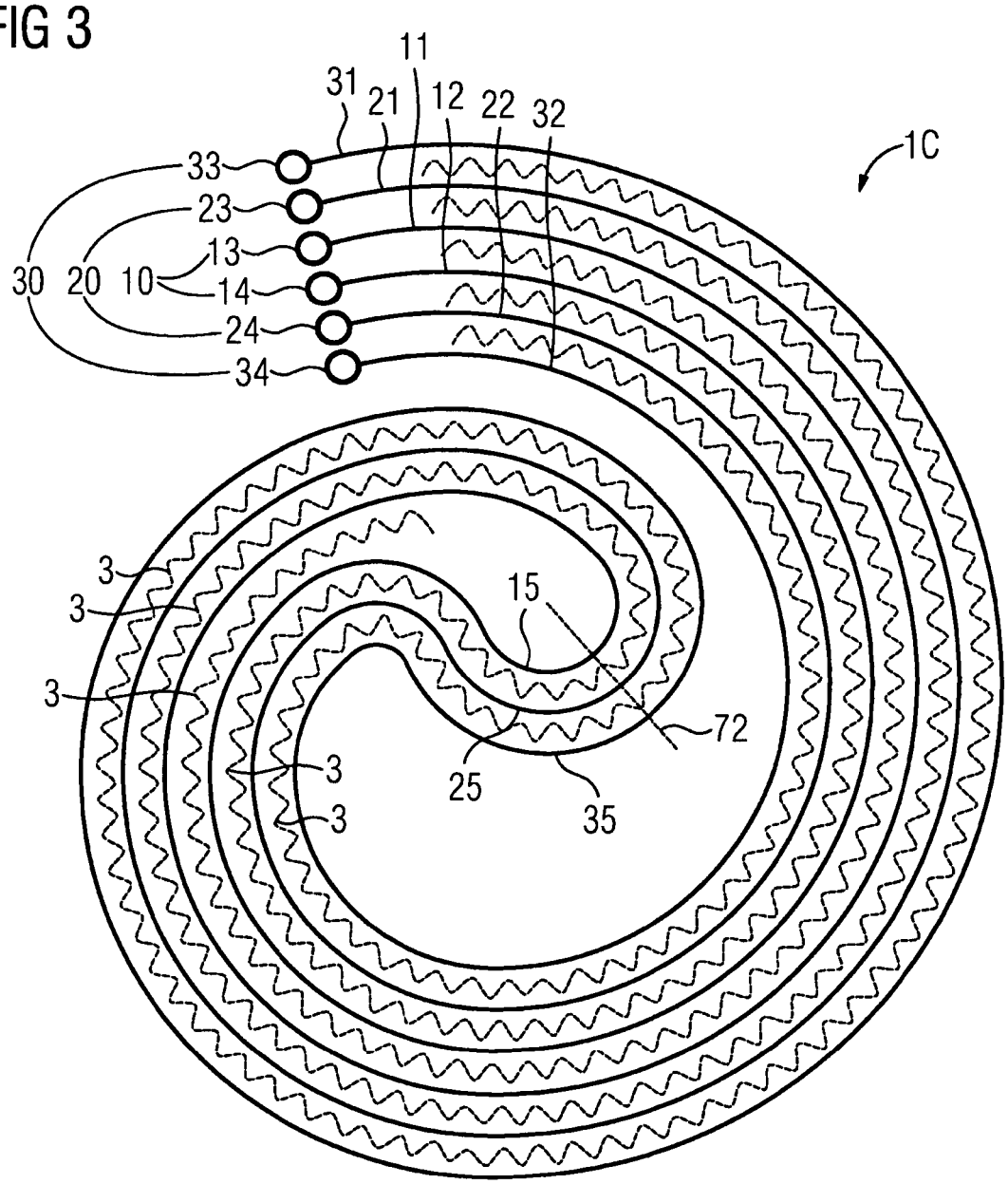
FIG. 3 shows a conductor arrangement analogous to that in FIG. 1, with U-shaped connection points.

FIG. 3 shows a schematic illustration of a further alternative embodiment of the conductor arrangement 1C. In contrast to the conductor arrangement 1A shown in FIG. 1, the conductor arrangement 1C in FIG. 3 has conductor assemblies 10, 20, 30 which are stacked one inside the other with stacked connection points 15, 25, 35 arranged on a straight line 72. Spacers 3 are arranged between the conductor ribbons 2. The connection points 15, 25, 35 are in each case U-shaped, with the U-shape being bent on one side by winding the turns to form a spiral. A further difference between the embodiment illustrated in FIG. 3 and the embodiment of the conductor arrangement 1A in FIG. 1 is the arrangement of the connections 13, 14, 23, 24, 33, 34. In FIG. 3, the connections are not arranged uniformly on the circumference of the spiral, as in FIG. 1, but are stacked one on top of the other at one point on the circumference of the spiral, on the plane of the drawing. The embodiment illustrated in FIG. 1 has the advantage of a better withstand voltage in comparison to the embodiment shown in FIG. 3, since the connections are spatially further apart from one another. For contact-making reasons, however, the arrangement shown in FIG. 3 may be advantageous in certain cases.

Figure 4:
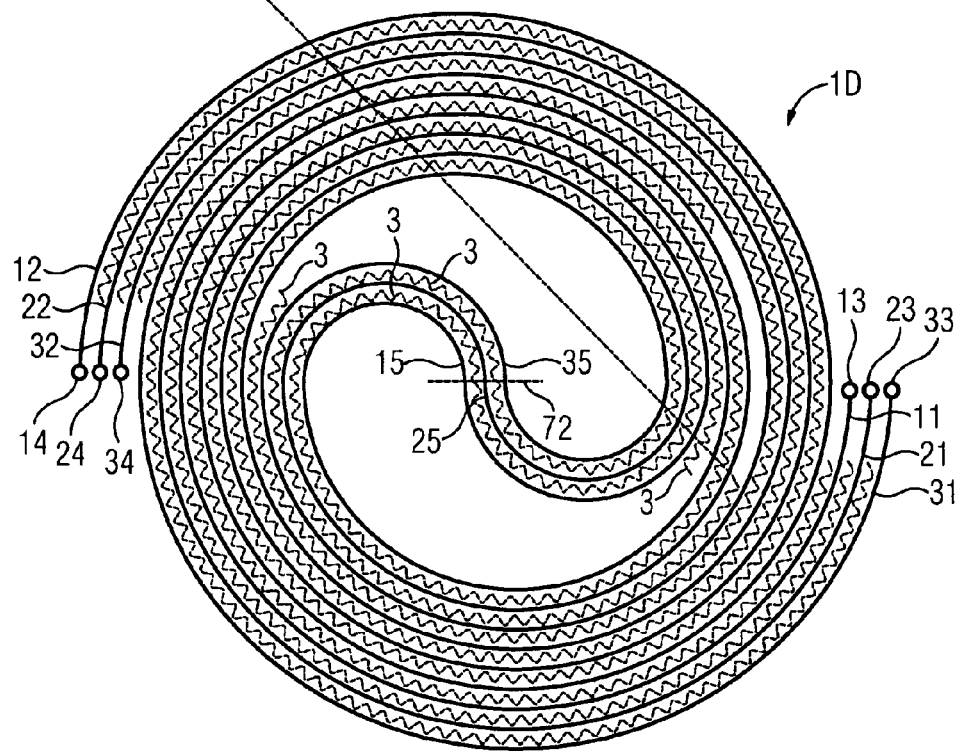
FIG. 4 shows a conductor arrangement analogous to that in FIG. 3, with U-shaped and S-shaped connection points.

FIG. 4 shows a schematic illustration of a further alternative embodiment of the conductor arrangement 1D. Analogously to the conductor arrangement 1C shown in FIG. 3, the conductor arrangement 1D in FIG. 4 has conductor assemblies 10, 20, 30 which are stacked one inside the other, with stacked connection points 15, 25, 35 which are arranged on a straight line 72 and are U-shaped or S-shaped. Spacers 3 are arranged between the conductor ribbons 2. In contrast to the embodiment shown in FIG. 3, the connections 12, 22, 32 of the conductor assemblies 10, 20, 30 are each stacked one on top of the other on the plane of the drawing from the first conductor part 11, 21, 31 on a circumferential side of the spiral along a straight line through the center point of the spiral, while the connections 13, 23, 33 are each arranged stacked one on top of the other on the same straight line, in each case from the second conductor part 14, 24, 34 of the conductor assemblies 10, 20, 30, on the opposite circumferential side of the spiral. The embodiment shown in FIG. 4 has a very high withstand voltage.

Figure 5:
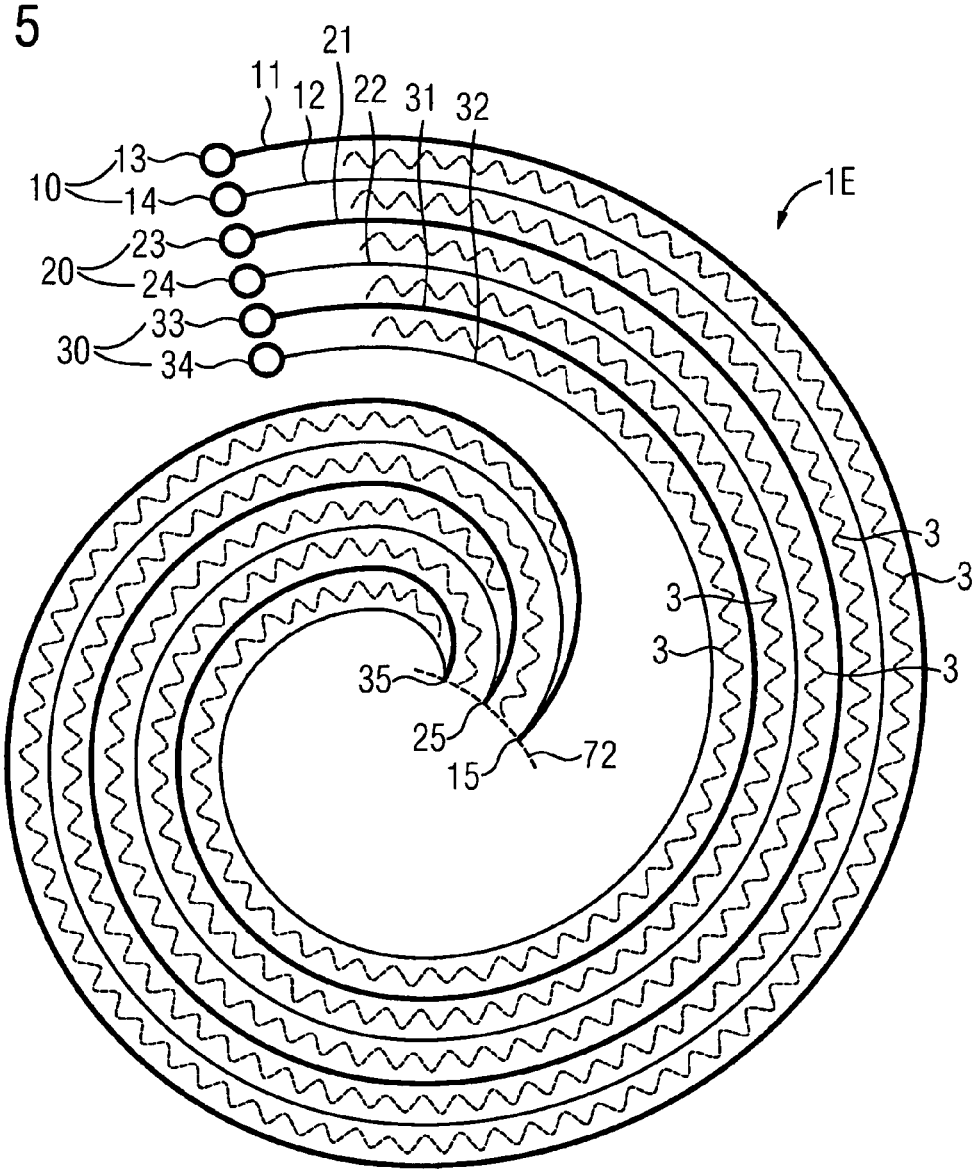
FIG. 5 shows a conductor arrangement analogous to that in FIG. 1, with connection points shaped such that they are pointed.

FIG. 5 shows a schematic illustration of a further alternative embodiment of the conductor arrangement 1E, having connection points 15, 25, 35 which run to a point. Analogously to the conductor arrangement 1A shown in FIG. 1, the conductor arrangement 1E in FIG. 5 has no connection points 15, 25, 35 which are stacked one inside the other, but alongside one another, for the conductor assemblies 10, 20, 30. The stacking sequence of the conductor parts in the exemplary embodiment shown in FIG. 5 is, from the outside to the inside of the spiral, 11, 12, 21, 22, 31, 32, as a result of which the conductor parts in a conductor assembly are always each arranged adjacent to one another. In contrast to this, the stacking sequence of the conductor parts from the outside to the inside of the spiral in the embodiments shown in FIGS. 3 and 4 is 31, 21, 11, 12, 22, 32. In the latter case, the conductor assemblies are therefore stacked one inside the other, that is to say interleaved in one another, and, except for the innermost and outermost conductor assemblies 10 and 30, conductor parts are always directly adjacent exclusively to conductor parts of another conductor assembly. In FIG. 5, the connection points 15, 25, 35 in the interior of the spiral are stacked one on top of the other along a curved line 72 along the plane of the drawing.

Figure 6:
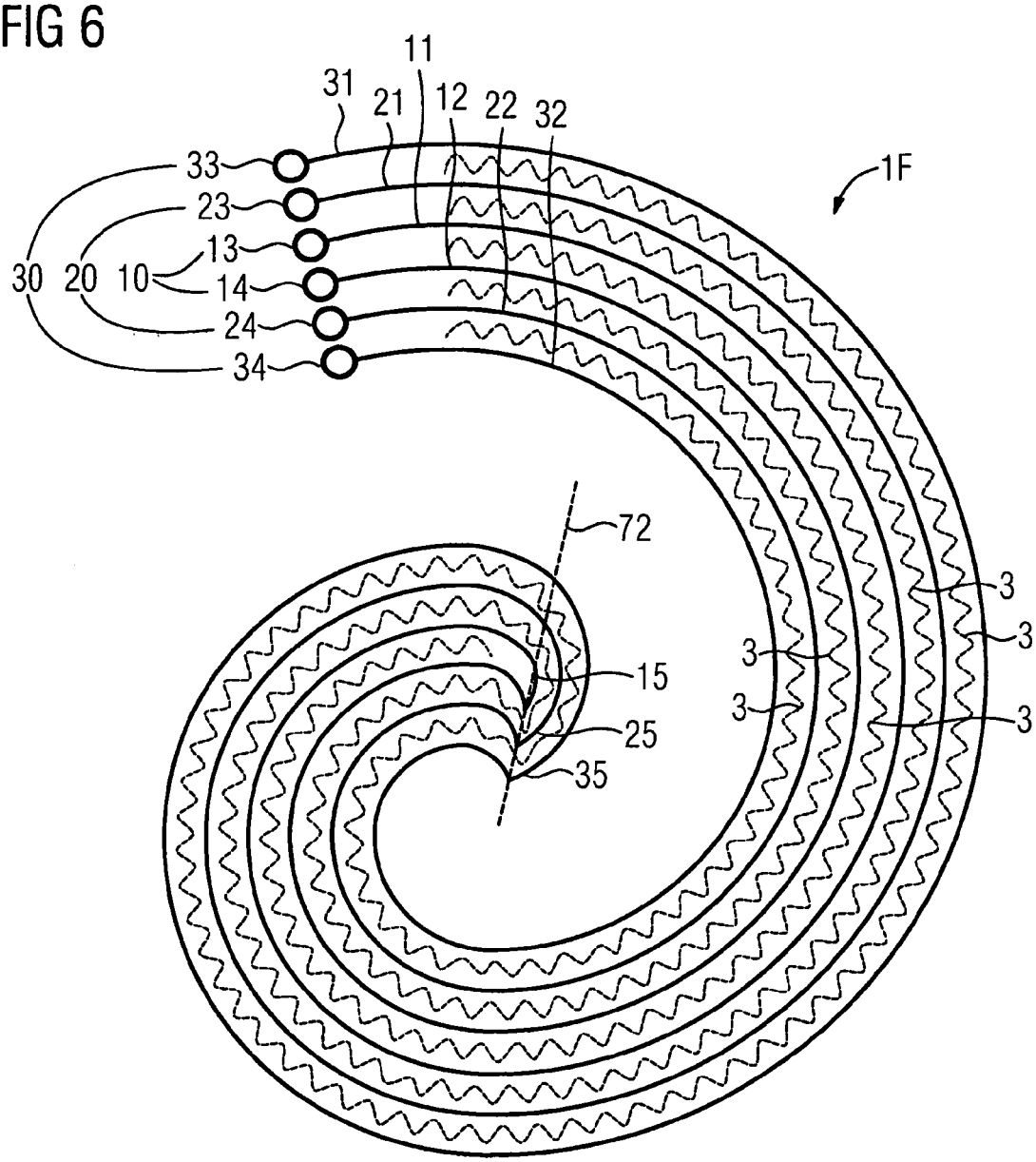
FIG. 6 shows a conductor arrangement analogous to that in FIG. 4, with connection points interleaved into one another.

A further exemplary embodiment of the conductor arrangement 1F is shown in FIG. 6, in which connection points which run to a point are arranged interleaved in one another. The embodiment illustrated in FIG. 6 therefore corresponds to the embodiment 1C illustrated in FIG. 3, with the exception of the shape of the connection points 15, 25, 35.

A combination of individual features of the embodiments 1A to 1F shown in FIGS. 1 to 6 is possible. In particular, the arrangement of the connections may be chosen independently of the arrangement of the connection points.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A conductor arrangement for a resistive switching element, comprising:
    at least two conductor assemblies, each comprising at least one superconducting conductor ribbon having two conductor parts, which run parallel and form a bifilar structure, the at least two conductor assemblies running adjacent to one another on a common plane, the at least two conductor assemblies being insulated from one another to form a common coil winding, whose turns run substantially in a spiral form.

2. The conductor arrangement as claimed in claim 1, wherein the spiral form is an Archimedes, a logarithmic, a hyperbolic or a fermatic spiral form.

3. The conductor arrangement as claimed in claim 1, wherein the two conductor parts which run parallel and form the bifilar structure in each conductor assembly are each electrically and/or mechanically connected to one another at their ends and/or starts, where a connection point is formed.

4. The conductor arrangement as claimed in claim 3, wherein the connection point of each conductor assembly is in the form of two starts and/or ends, which run to one another at a point, of the conductor parts.

5. The conductor arrangement as claimed in claim 3, wherein
    for each conductor assembly, a single conductor ribbon is bent to form the two conductor parts such that the connection point is formed from a bend,
    the bend of each conductor assembly is a U-shaped bend, each conductor assembly is bent to one side of the U-shaped bend.

6. The conductor arrangement as claimed in claim 3, wherein
    for each conductor assembly, a single conductor ribbon is bent to form the two conductor parts such that the connection point is formed from a bend, and
    the bend of each conductor assembly is formed in a U-shape, in particular in a shape which is bent to one side of the U-shape, and/or in that the connection point is in the form of a double U-shape, in particular, an S-shaped bend.

7. The conductor arrangement as claimed in claim 3, wherein each conductor ribbon has a partially circular shape at the connection point of the conductor assembly.

8. The conductor arrangement as claimed in claim 3, wherein the conductor arrangement has at least two connection points arranged in a stack within the common plane.

9. The conductor arrangement as claimed in claim 3, wherein the conductor arrangement has at least two connection points arranged on a circumference of an ellipse within the common plane.

10. The conductor arrangement as claimed in claim 9, wherein the conductor arrangement has at least three connection points distributed uniformly on a circumference of the ellipse.

11. The conductor arrangement as claimed in claim 3, wherein the at least two connection points are arranged close to a center of the spiral form.

12. The conductor arrangement as claimed in claim 1, wherein the superconducting conductor ribbon is formed of a high-temperature superconductor material.

13. The conductor arrangement as claimed in claim 1, wherein
insulation in the form of at least one spacer is formed between adjacent conductor parts, and
the at least one spacer separates adjacent conductor parts a distance within a range of from 2 to 3 mm.

14. The conductor arrangement as claimed in claim 13, wherein
an intra-assembly spacer is formed between the two conductor parts of each conductor assembly, and
an inter-assembly spacer is formed between adjacent conductor assemblies.

15. The conductor arrangement as claimed in claim 1, wherein
the two conductor parts of each conductor assembly carry current in opposite directions, and
adjacent conductor parts of adjacent conductor assemblies carry currents in opposite directions.

16. The conductor arrangement as claimed in claim 1, wherein the at least two conductor assemblies are connected in series.

17. The conductor arrangement as claimed in claim 1, wherein the at least two conductor assemblies are connected in parallel.

18. The conductor arrangement as claimed in claim 3, wherein the connection points of the at least two conductor assemblies are electrically and/or mechanically connected to one another.

\* \* \* \* \*